US012580018B2

(12) United States Patent
Liu et al.

(10) Patent No.: US 12,580,018 B2
(45) Date of Patent: Mar. 17, 2026

(54) ADDITIONAL SILICIDE LAYER ON TOP OF STAIRCASE FOR 3D NAND WL CONTACT CONNECTION

(71) Applicant: INTEL NDTM US LLC, Santa Clara, CA (US)

(72) Inventors: Liu Liu, Liaoning (CN); Junchao Ding, Liaoning (CN); Yingming Liu, Liaoning (CN); Jong Sun Sel, Liaoning (CN); Yixin Ma, Liaoning (CN); Jinwoo Lee, Liaoning (CN); Xi Lin, Liaoning (CN)

(73) Assignee: INTEL NDTM US LLC, Santa Clara, CA (US)

( * ) Notice: Subject to any disclaimer, the term of this patent is extended or adjusted under 35 U.S.C. 154(b) by 830 days.

(21) Appl. No.: 17/549,685

(22) Filed: Dec. 13, 2021

(65) Prior Publication Data

US 2023/0139346 A1 May 4, 2023

Related U.S. Application Data

(63) Continuation of application No. PCT/CN2021/126975, filed on Oct. 28, 2021.

(51) Int. Cl.
*G11C 8/14* (2006.01)
*G11C 16/04* (2006.01)
(Continued)

(52) U.S. Cl.
CPC ............ *G11C 16/0483* (2013.01); *G11C 8/14* (2013.01); *H10B 41/27* (2023.02); *H10B 41/35* (2023.02); *H10B 43/27* (2023.02); *H10B 43/35* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10;
(Continued)

(56) References Cited

U.S. PATENT DOCUMENTS

2005/0280068 A1* 12/2005 Wang ..................... H10B 41/30
257/314
2009/0001444 A1* 1/2009 Matsuoka .............. H10B 69/00
257/E21.422
(Continued)

*Primary Examiner* — William B Partridge
*Assistant Examiner* — Gustavo G Ramallo
(74) *Attorney, Agent, or Firm* — Morgan, Lewis & Bockius LLP

(57) ABSTRACT

An embodiment of an apparatus may include a substrate, a memory array of vertical 3D NAND strings formed in the substrate, a staircase region formed in the substrate, a polysilicon wordline extended horizontally into the staircase region, a wordline contact extended vertically through the staircase region to make electrical contact with the polysilicon wordline, and a punch stop layer disposed between the wordline contact and the polysilicon wordline. Other embodiments are disclosed and claimed.

18 Claims, 11 Drawing Sheets

(51) Int. Cl.

| | | |
|---|---|---|
| *H10B 41/27* | (2023.01) | |
| *H10B 41/35* | (2023.01) | |
| *H10B 43/27* | (2023.01) | |
| *H10B 43/35* | (2023.01) | |

(58) Field of Classification Search
CPC ........ H10B 51/20; H10B 51/30; H10B 51/40; H10B 51/50; H01L 27/1027; H01L 27/1028
See application file for complete search history.

(56) References Cited

U.S. PATENT DOCUMENTS

| | | | | |
|---|---|---|---|---|
| 2009/0065844 | A1* | 3/2009 | Iinuma | H10B 41/35 |
| | | | | 257/E21.209 |
| 2011/0031630 | A1* | 2/2011 | Hashimoto | H10B 43/20 |
| | | | | 257/E21.585 |
| 2017/0278861 | A1* | 9/2017 | Sonehara | H10B 43/10 |
| 2018/0151497 | A1* | 5/2018 | Makala | H01L 29/7833 |

* cited by examiner

10

WL Contact          Substrate

Poly WL

Poly WL

Poly WL

Vertical 3D NAND strings          Staircase region

| Polysilicon | Insulator | Nitride |
| --- | --- | --- |
| Punch Stop | Conductive | 3D NAND String |

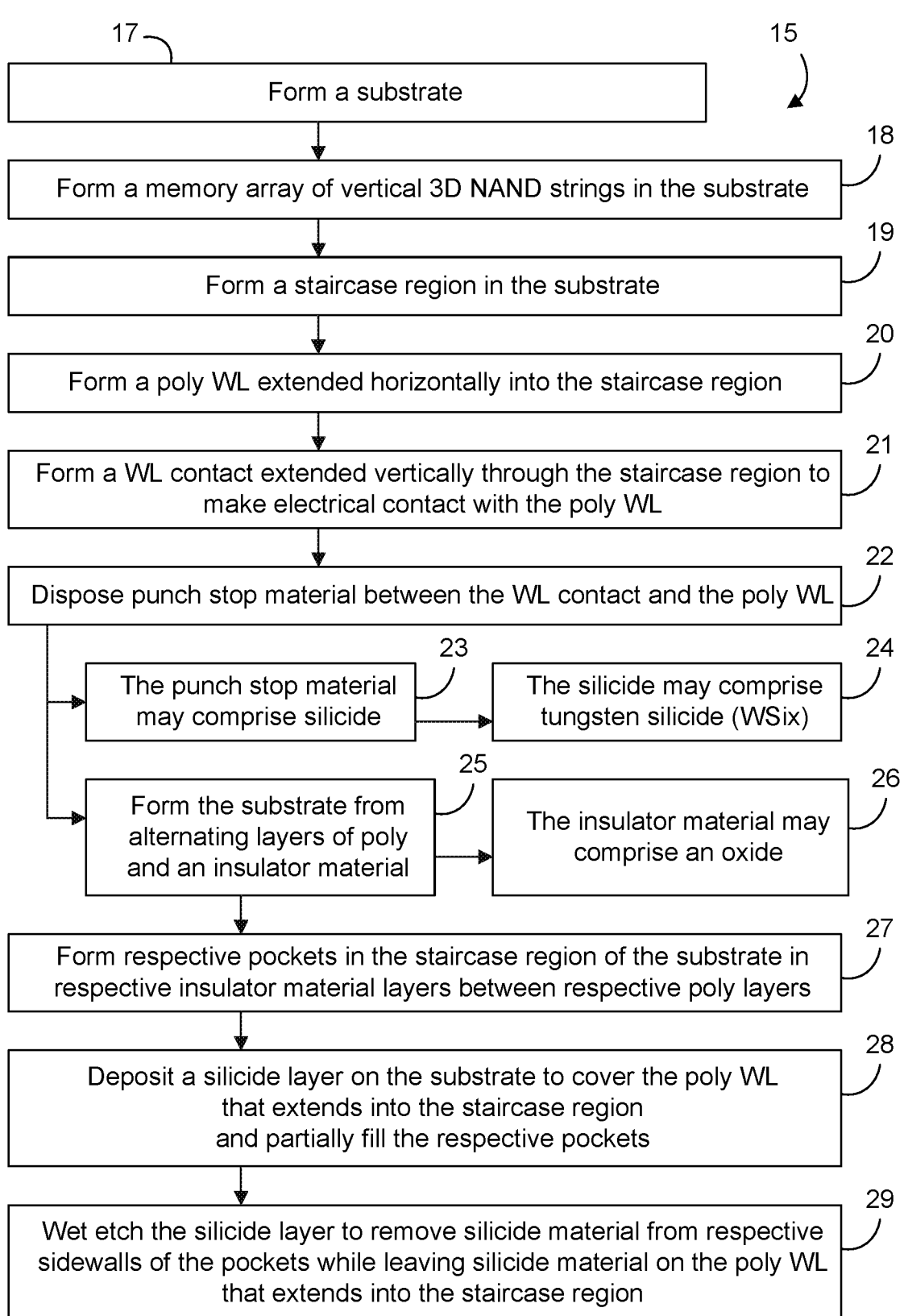

17

15

Form a substrate

18

Form a memory array of vertical 3D NAND strings in the substrate

19

Form a staircase region in the substrate

20

Form a poly WL extended horizontally into the staircase region

21

Form a WL contact extended vertically through the staircase region to make electrical contact with the poly WL

22

Dispose punch stop material between the WL contact and the poly WL

23

The punch stop material may comprise silicide

24

The silicide may comprise tungsten silicide (WSix)

25

Form the substrate from alternating layers of poly and an insulator material

26

The insulator material may comprise an oxide

27

Form respective pockets in the staircase region of the substrate in respective insulator material layers between respective poly layers

28

Deposit a silicide layer on the substrate to cover the poly WL that extends into the staircase region and partially fill the respective pockets

29

Wet etch the silicide layer to remove silicide material from respective sidewalls of the pockets while leaving silicide material on the poly WL that extends into the staircase region

FIG. 2

Channels

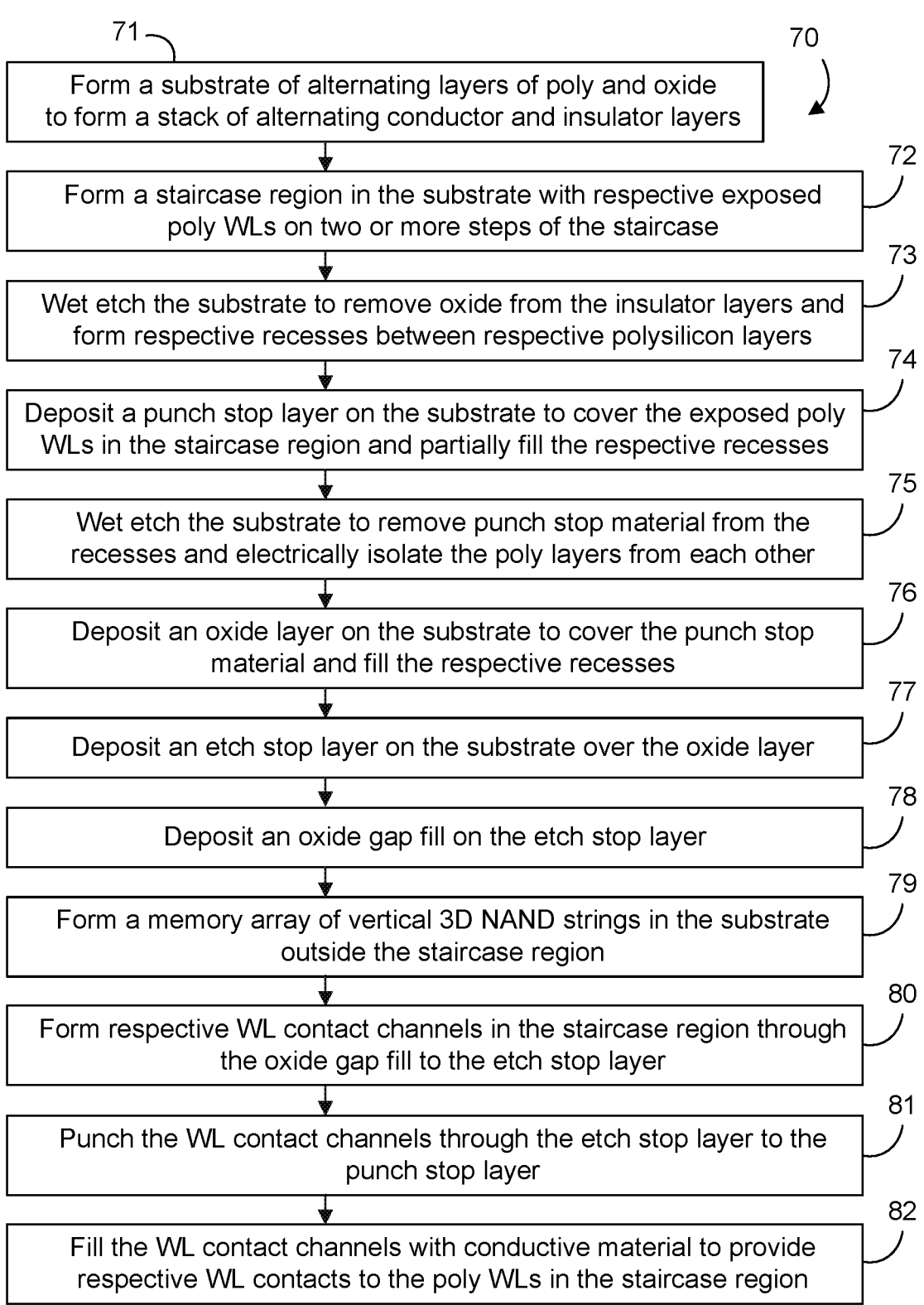

71 ⌐

70

Form a substrate of alternating layers of poly and oxide to form a stack of alternating conductor and insulator layers

72

Form a staircase region in the substrate with respective exposed poly WLs on two or more steps of the staircase

73

Wet etch the substrate to remove oxide from the insulator layers and form respective recesses between respective polysilicon layers

74

Deposit a punch stop layer on the substrate to cover the exposed poly WLs in the staircase region and partially fill the respective recesses

75

Wet etch the substrate to remove punch stop material from the recesses and electrically isolate the poly layers from each other

76

Deposit an oxide layer on the substrate to cover the punch stop material and fill the respective recesses

77

Deposit an etch stop layer on the substrate over the oxide layer

78

Deposit an oxide gap fill on the etch stop layer

79

Form a memory array of vertical 3D NAND strings in the substrate outside the staircase region

80

Form respective WL contact channels in the staircase region through the oxide gap fill to the etch stop layer

81

Punch the WL contact channels through the etch stop layer to the punch stop layer

82

Fill the WL contact channels with conductive material to provide respective WL contacts to the poly WLs in the staircase region

FIG. 7

ADDITIONAL SILICIDE LAYER ON TOP OF STAIRCASE FOR 3D NAND WL CONTACT CONNECTION

CLAIM FOR PRIORITY

This application claims priority to International Patent Application No. PCT/CN2021/126975, filed Oct. 28, 2021 and titled "ADDITIONAL SILICIDE LAYER ON TOP OF STAIRCASE FOR 3D NAND WL CONTACT CONNECTION," which is incorporated by references in its entirety for all purposes.

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another to form a vertical NAND string. With an increased number of tiers in 3D NAND, and increased block size, the minimum data unit that can be erased at once also increases. To reduce the block size, some 3D NAND memory devices may utilize a block-by-deck (BBD) architecture. In an example BBD architecture, the tiers are divided into 3 decks, with 48 write-lines (WLs) in each deck, and the block size is reduced from 144 MB to 48 MB. Decks can be assigned to any combination of quad-level cell (QLC) or single-level cell (SLC) blocks. In a floating gate flash cell, a conductive floating gate may be positioned between a control gate and a channel of a transistor. The individual memory cells of the vertical NAND string may be on different layers arranged around a body that extends outward from a substrate, with the conductive floating gate (charge storage region) located on a similar or same plane as the control gate, extending outward horizontally from the body.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2 is an illustrative diagram of an example of a method according to an embodiment;

FIG. 7 is a flow chart of an example of a method of manufacturing a memory device according to an embodiment.

DETAILED DESCRIPTION

Figure 1:
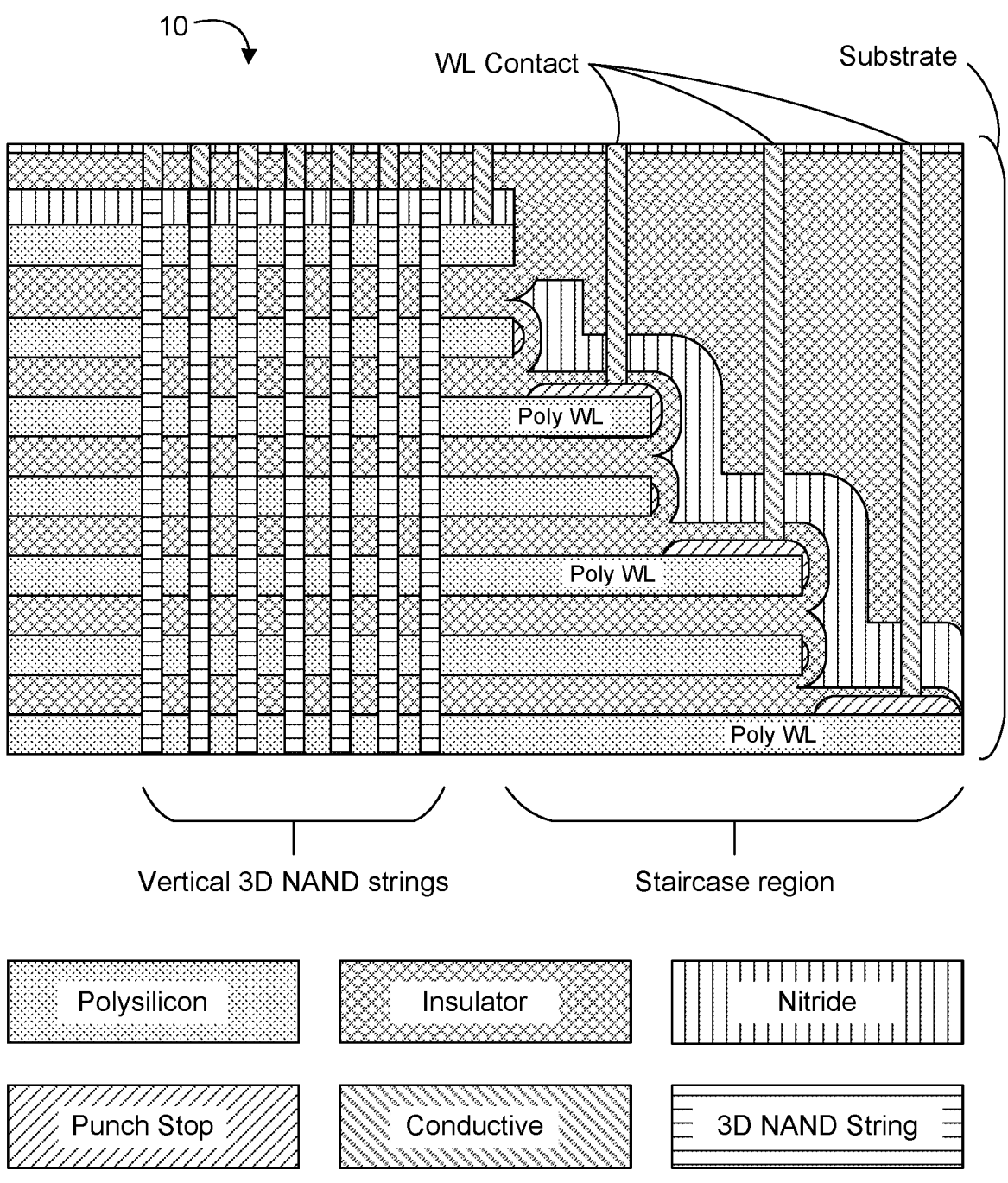
FIG. 1 is an illustrative diagram of an example of an apparatus according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within $+/-10\%$ of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Some embodiments provide technology for an additional silicide layer on top of a staircase structure for a three-dimensional (3D) NAND wordline (WL) contact connection. Some 3D NAND technology involves the formation of a staircase to land WL contacts. As 3D NAND technology keeps scaling in an increased number of tiers, the depth of the staircase also increases. This imposes difficulty for a WL contact formation, which includes two important aspects: 1) contact etch underetch/overetch control; and 2) a sufficiently clean contact and silicide formation. Embodiments may advantageously overcome one or more problems to improve both aspects by introducing a silicide layer right after staircase formation.

Some 3D NAND devices may utilize polysilicon (poly) material for the WLs, which may not be a good etch stop material for the WL contact etch. One example technique to improve the etch stopping capability of a poly WL may include depositing an additional SiN layer on top of the WL poly after staircase formation for use as an etch stop for the WL contact etch. After the WL contact etch stops on this SiN layer, a punch step is then performed to punch through the SiN layer and stop on the WL poly. This example may improve the contact etch overetch/underetch window significantly. A problem with this technique is that as 3D NAND keeps scaling in an increased number of tiers, the thickness of the SiN stopping layer needs to be increased, which imposes an increased challenge in the following punch step, as the punch needs to punch through thicker SiN layer and stop on the WL poly (e.g., which may remain the same thickness generation over generation).

Another problem with this example technique is that the increased aspect ratio of the WL contacts can result in insufficient polymer clean after the contact etches. To make the problem worse, WL poly is easily damaged with common clean chemistry (HF/SC1, etc.), which limits the chemical budget during the clean process and makes the clean more challenging. After contact etch and clean, silicide formation may also be more difficult because of the high aspect ratio and insufficient post-etch clean. The surface of the WL poly is either damaged or covered by etch polymer, which prevents good silicide formation.

One example technique to improve the WL selectivity during etch includes converting part of WL poly into silicide by a silicidation process, and using it as etch stopping layer. A problem with this technique is that simply converting polysilicon into silicide may not improve etch selectivity significantly. Another problem with this example technique is that the silicidation process consumes silicon to make silicide so the remaining poly thickness may be reduced. The newly formed silicide+remaining poly end up roughly equally problematic for etch stopping capability as compared to the original poly.

In accordance with some embodiments, a silicide layer is formed right after staircase formation by physical vapor deposition (PVD). The silicide layer acts as a stop layer for the SiN punch, as well as a silicide layer between WL poly and WL contacts. Advantageously, embodiments of the additional silicide layer may improve a process window for a WL contact punch process, which can later translate into faster time-to-market and better yield. Another advantage is that embodiments may provide an integration solution to improve the contact resistance which may be challenge in terms of defects per million (DPM).

With reference to FIG. 1, an embodiment of an apparatus 10 may include a substrate, a memory array of vertical 3D NAND strings formed in the substrate, a staircase region formed in the substrate, a poly WL extended horizontally into the staircase region, a WL contact extended vertically through the staircase region to make electrical contact with the poly WL, and a punch stop material disposed between the WL contact and the polysilicon WL. The different elements/materials are labeled and/or indicated by the legend of different patterns in FIG. 1. For example, the punch stop material may be a silicide, such as tungsten silicide (WSix). In some embodiments, the substrate may comprise alternating layers of poly and an insulator material as illustrated in FIG. 1. For example, the insulator material may comprise an oxide. In some embodiments, the apparatus 10 may further include a pocket formed in the insulator material layer between two poly layers adjacent to the punch stop material (e.g., see FIG. 6).

With reference to FIG. 2, an embodiment of a method 15 may include forming a substrate at box 17, forming a memory array of vertical 3D NAND strings in the substrate at box 18, forming a staircase region in the substrate at box 19, forming a poly WL extended horizontally into the staircase region at box 20, forming a WL contact extended vertically through the staircase region to make electrical contact with the poly WL at box 21, and disposing punch stop material between the WL contact and the poly WL at box 22. For example, wherein the punch stop material may comprise silicide at box 23. In some embodiments, the silicide may comprise tungsten silicide (WSix) at box 24.

Some embodiments of the method 15 may further include forming the substrate from alternating layers of poly and an insulator material at box 25. For example, the insulator material may comprise an oxide at box 26. The method 15 may also include forming respective pockets in the staircase region of the substrate in respective insulator material layers between respective poly layers at box 27, depositing a silicide layer on the substrate to cover the poly WL that extends into the staircase region and partially fill the respective pockets at box 28, and wet etching the silicide layer to remove silicide material from respective sidewalls of the pockets while leaving silicide material on the poly WL that extends into the staircase region at box 29.

FIGS. 3A to 3F, 4A to 4D, and 5A to 5C show an embodiment of a process flow to form a silicide stopping layer on top of WL poly in a staircase, where similar materials/layers are indicated by the legend of different patterns in FIG. 1.

Figure 3A:
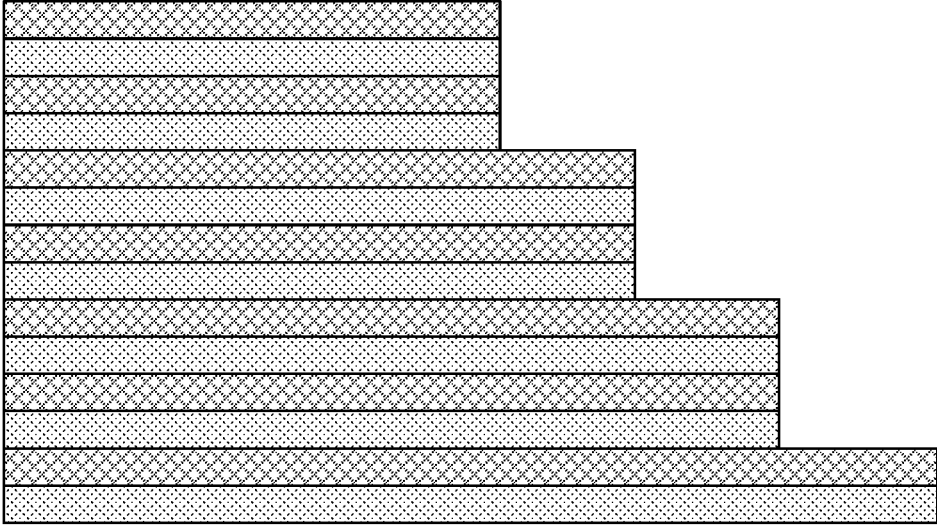
FIGS. 3A to 3F are illustrative diagrams of an example of a process according to an embodiment.
Figure 3B:
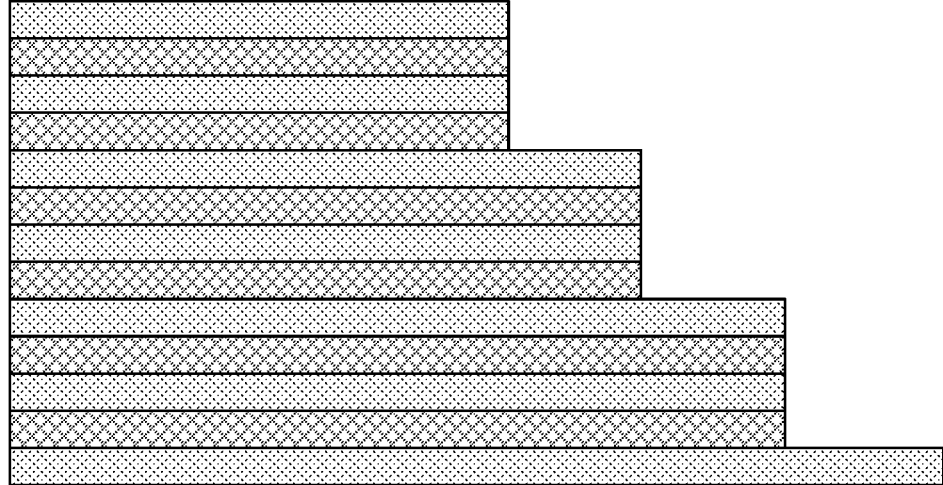
Figure 3C:
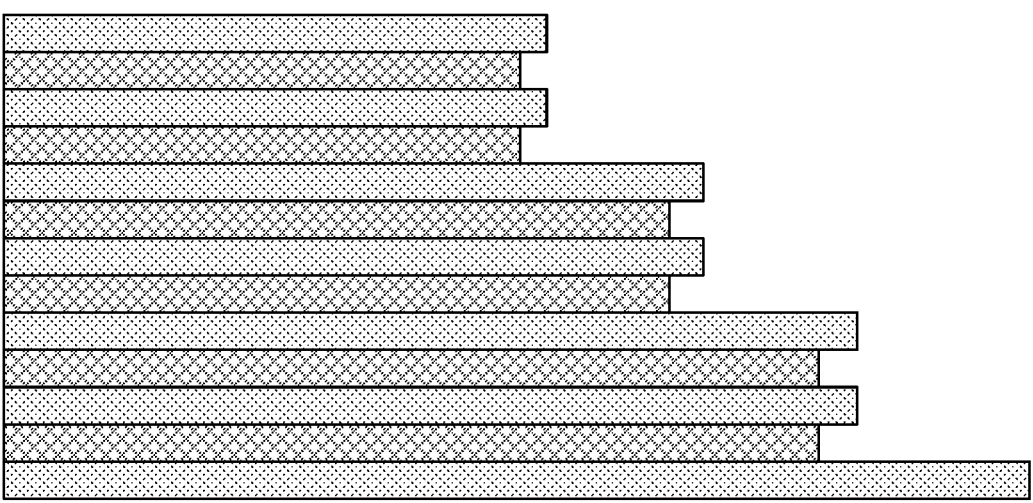
Figure 3D:
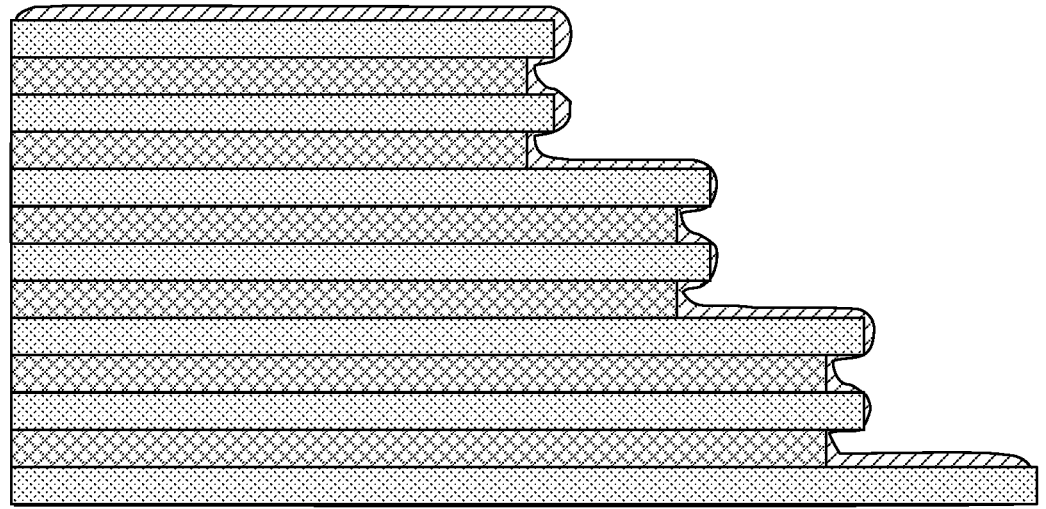
Figure 3E:
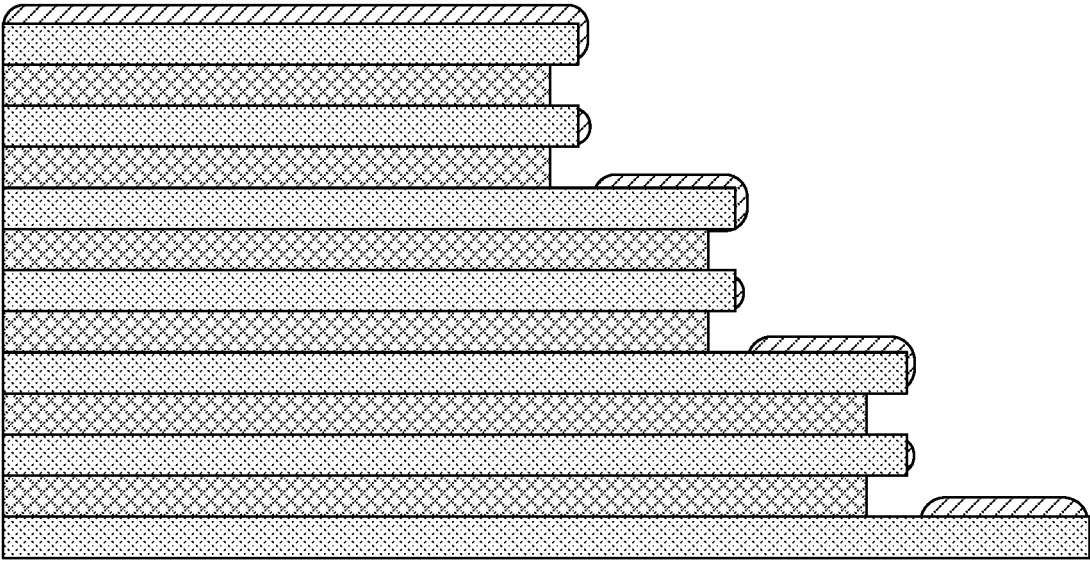
Figure 3F:
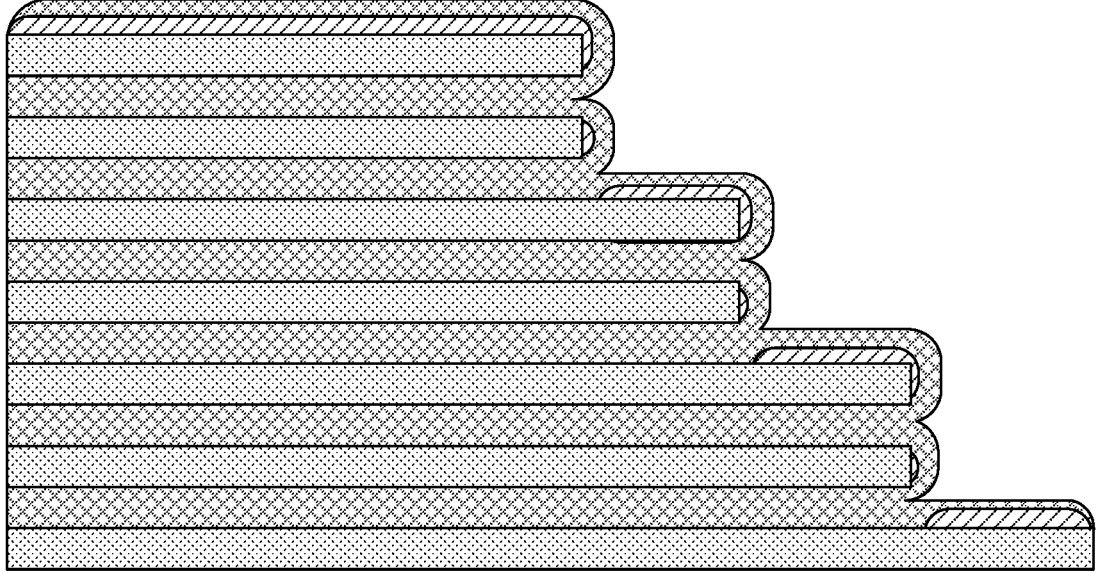

With reference to FIGS. 3A to 3F, an embodiment of a process may start with a staircase formation in a substrate of alternating oxide and polysilicon layers (FIG. 3A). The oxide is then etched to expose polysilicon (FIG. 3B). A wet etch process forms a recess in the oxide layers (FIG. 3C). Tungsten silicide (WSix) is then deposited on the polysilicon (FIG. 3D). A wet etch process removes WSix on the oxide sidewall (FIG. 3E). Oxide is then deposited for adhesion (FIG. 3F, e.g., about 15 nm).

Figure 4A:
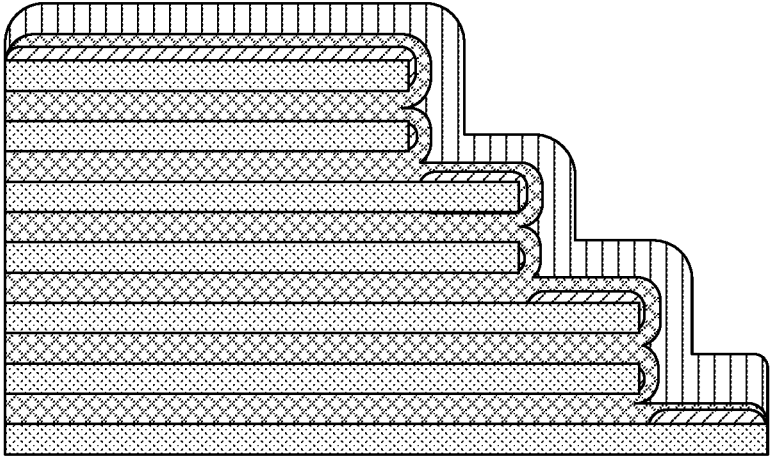
FIGS. 4A to 4D are illustrative diagrams of another example of a process according to an embodiment.
Figure 4B:
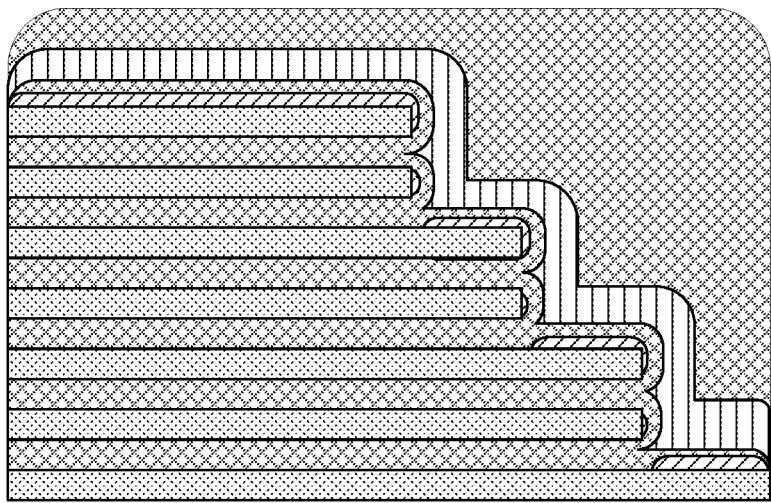
Figure 4C:
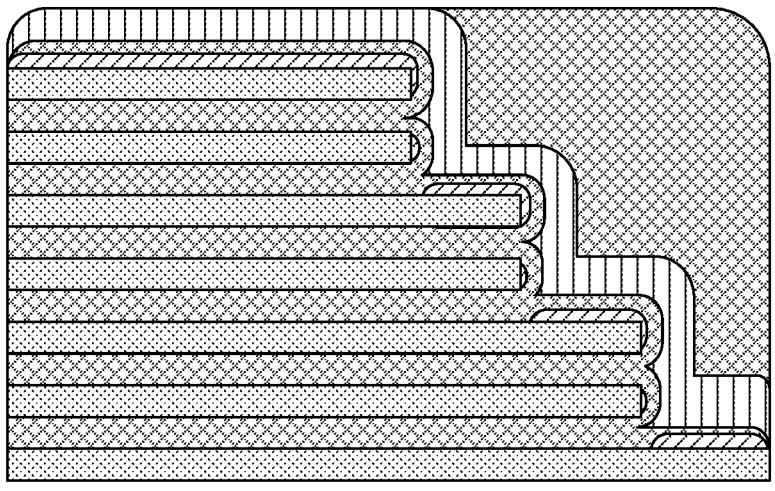
Figure 4D:
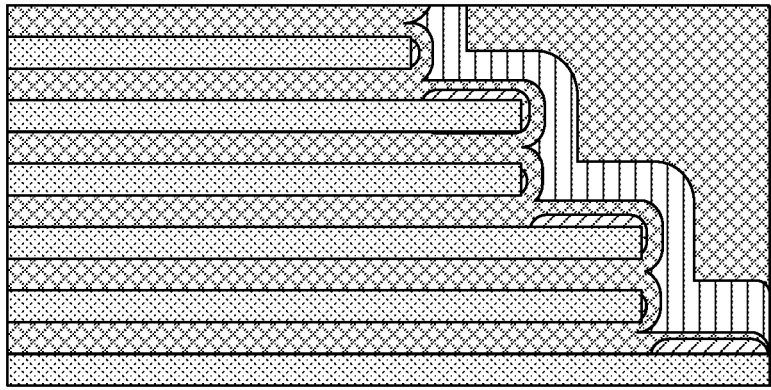

With reference to FIGS. 4A to 4D, an embodiment of a process may then deposit etch stop silicon nitride (SiN) on the oxide (FIG. 4A). Gap fill oxide may then be formed on the SiN to fill the staircase (FIG. 4B). A chemical mechanical process (CMP) may then be used to remove a portion of the oxide and expose the SiN (FIG. 4C). Any suitable process may then follow to form the memory array of 3D NAND strings. In the illustrated process, a sacrificial poly etch may remove the outer layers (SiN, oxide, WSix) and top layer of poly, to expose an oxide layer (FIG. 4D). Any suitable process may then be utilized to form pillars of the 3D NAND strings through the substrate and form the staircase area filled with oxide.

Figure 5A:
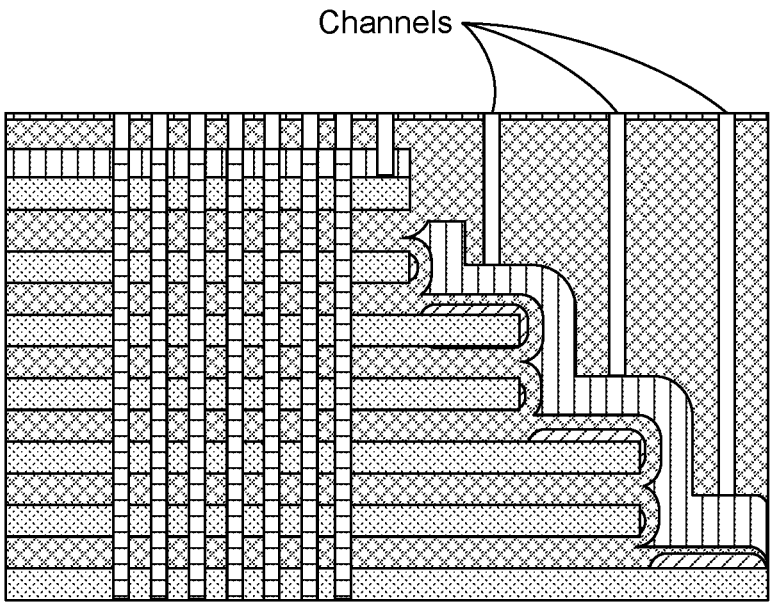
FIGS. 5A to 5C are illustrative diagrams of another example of a process according to an embodiment.
Figure 5B:
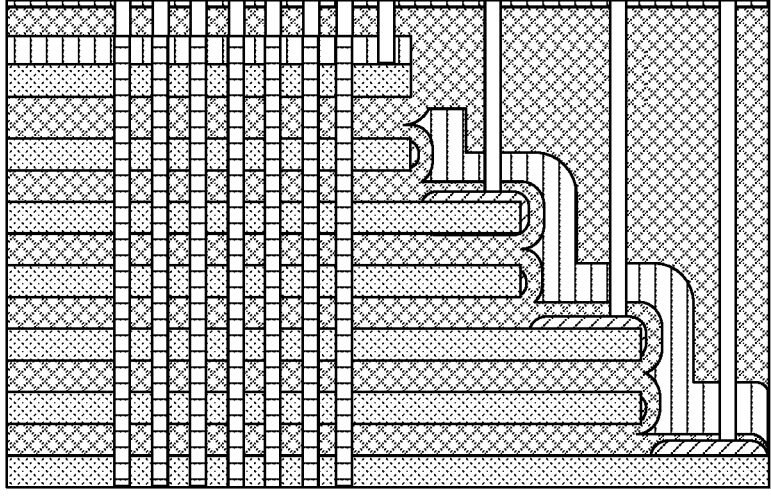
Figure 5C:
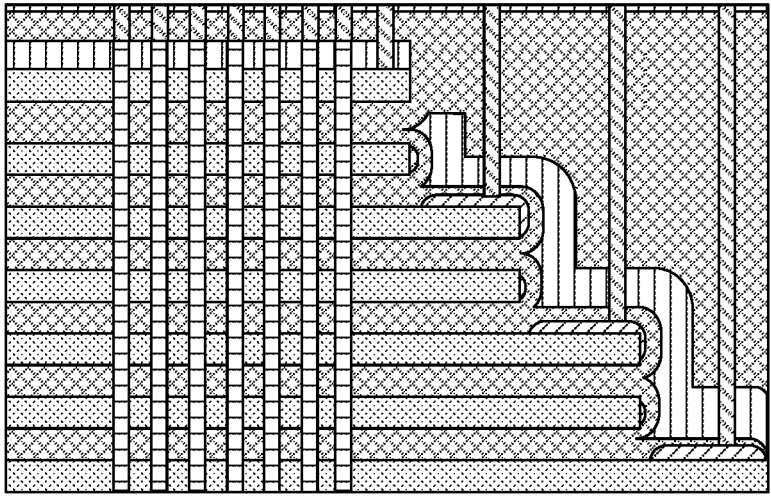

With reference to FIG. 5A to 5C, an embodiment of a process may then form channels for WL contacts (FIG. 5A). A punch process may extend the channels through the SiN layer, stopping at the WSix layer (FIG. 5B). The WL contacts may then be formed in the channels (FIG. 5C).

One aspect of the foregoing process flow is how the silicide is deposited on top of the staircase without shorting adjacent poly layers (N and N+1). In accordance with some embodiments, PVD or plasma-enhanced chemical vapor deposition (PECVD) silicide (WSix in this example) is used to create a thickness delta for silicide that deposits at vertical sidewalls (thinner) and planar surfaces (thicker). Also, a wet cut is used to remove the silicide film at the sidewalls to break the film and create WL-WL isolation. An oxide recess process is added in to create a pocket between WL poly at the exposed vertical boundaries of staircase. This pocket later becomes a weakest spot for silicide coverage that is used to break the silicide layers between poly. Any suitable thickness may be selected for the amount of deposited silicide and the amount of removed silicide, so long as enough silicide remains on the poly WL with no WL-WL shorts. Non-limiting examples include a deposition of 35 nm WSix followed by 20 nm of WSix wet recess, a deposition of 40 nm WSix followed by 25 nm of WSix wet recess, a deposition of 40 nm WSix followed by 27 nm of WSix wet recess, etc.

As compared to a WL poly silicidation technique, the silicide layer is added to the WL poly rather than by consuming the poly. In this way, the net gain is still positive for WL robustness. Advantageously, embodiments of the silicide layer added to the WL poly help with the punch and solve partial punch (chemical erosion of WL poly), rather than acting as insitu etch stopping. Insitu etch stopping is still mostly depending on the silicon nitride layer.

Figure 6:
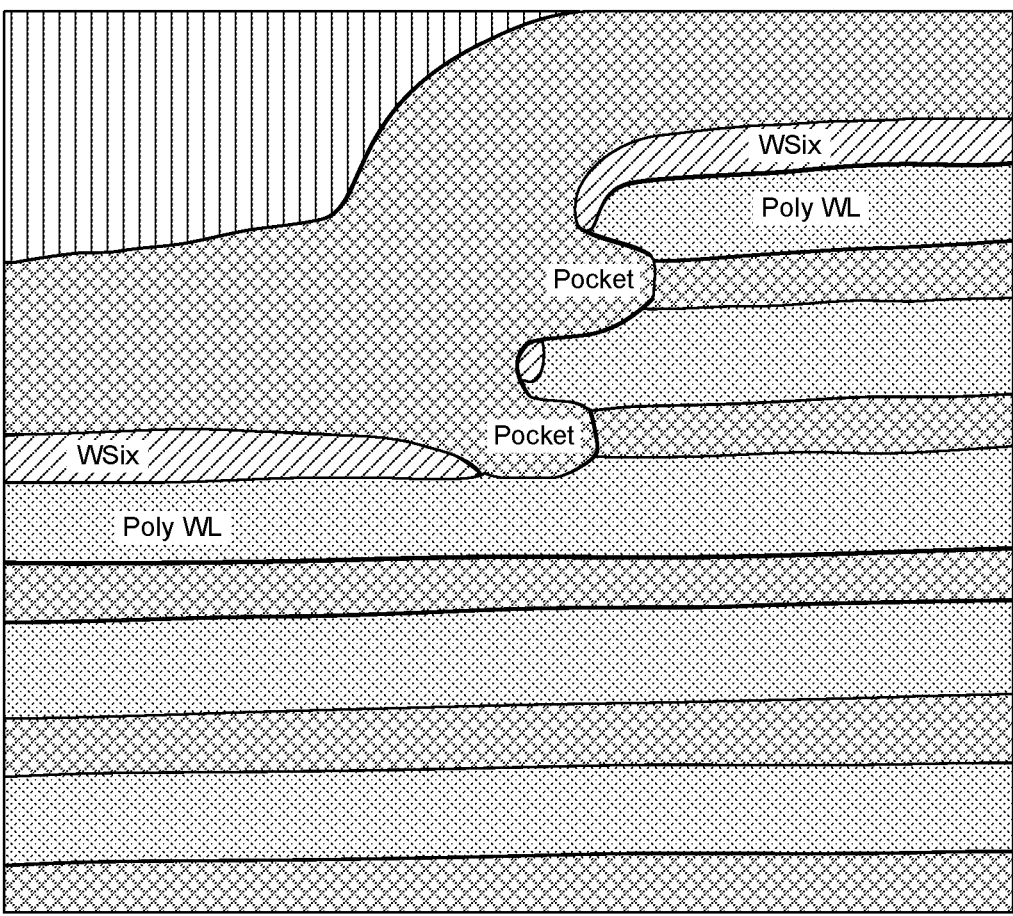
FIG. 6 is an illustrative TEM image of an example of an integrated circuit structure according to an embodiment.

With reference to FIG. 6, an embodiment of an integrated circuit structure 60 is shown as an illustrative representation of a transmission electron microscopy (TEM) image that shows features of a process as described herein that results in an additional silicide layer on top of WL poly in a staircase region of a 3D NAND memory device. The additional silicide layer is a punch stop layer, shown in profile at the staircase step region in FIG. 6. The additional silicide layer on top of the staircase provides a WL contact for a 3D NAND WL contact connection. Advantageously, on a wafer with the additional WSix punch stop layer on top of the WL poly, a contact punch is able to stop inside the WSix layer without touching the WL poly and WL poly erosion (partial punch) was significantly improved, which is shown by a much flatter and smoother contact bottom profile.

With reference to FIG. 7, an embodiment of a method 70 of manufacturing a memory device may include forming a substrate of alternating layers of poly and oxide to form a stack of alternating conductor and insulator layers at box 71, forming a staircase region in the substrate with respective exposed poly WLs on two or more steps of the staircase at box 72, wet etching the substrate to remove oxide from the insulator layers and form respective recesses between respective polysilicon layers at box 73, and depositing a punch stop layer on the substrate to cover the exposed poly WLs in the staircase region and partially fill the respective recesses at box 74. The method 70 may then include wet etching the substrate to remove punch stop material from the recesses and electrically isolate the respective poly layers from each other at box 75, and depositing an oxide layer on the substrate to cover the punch stop material and fill the respective recesses at box 76.

Some embodiments of the method 70 may then include depositing an etch stop layer on the substrate over the oxide layer at box 77, depositing an oxide gap fill on the etch stop layer at box 78, and forming a memory array of vertical 3D NAND strings in the substrate outside the staircase region at box 79. The method 70 may then include forming respective WL contact channels in the staircase region through the oxide gap fill to the etch stop layer at box 80, punching the WL contact channels through the etch stop layer to the punch stop layer at box 81, and filling the WL contact channels with conductive material to provide respective WL contacts to the poly WLs in the staircase region at box 82.

For example, the punch stop material may comprise silicide, such as WSix. For example, the etch stop layer may comprise silicon nitride.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 8:
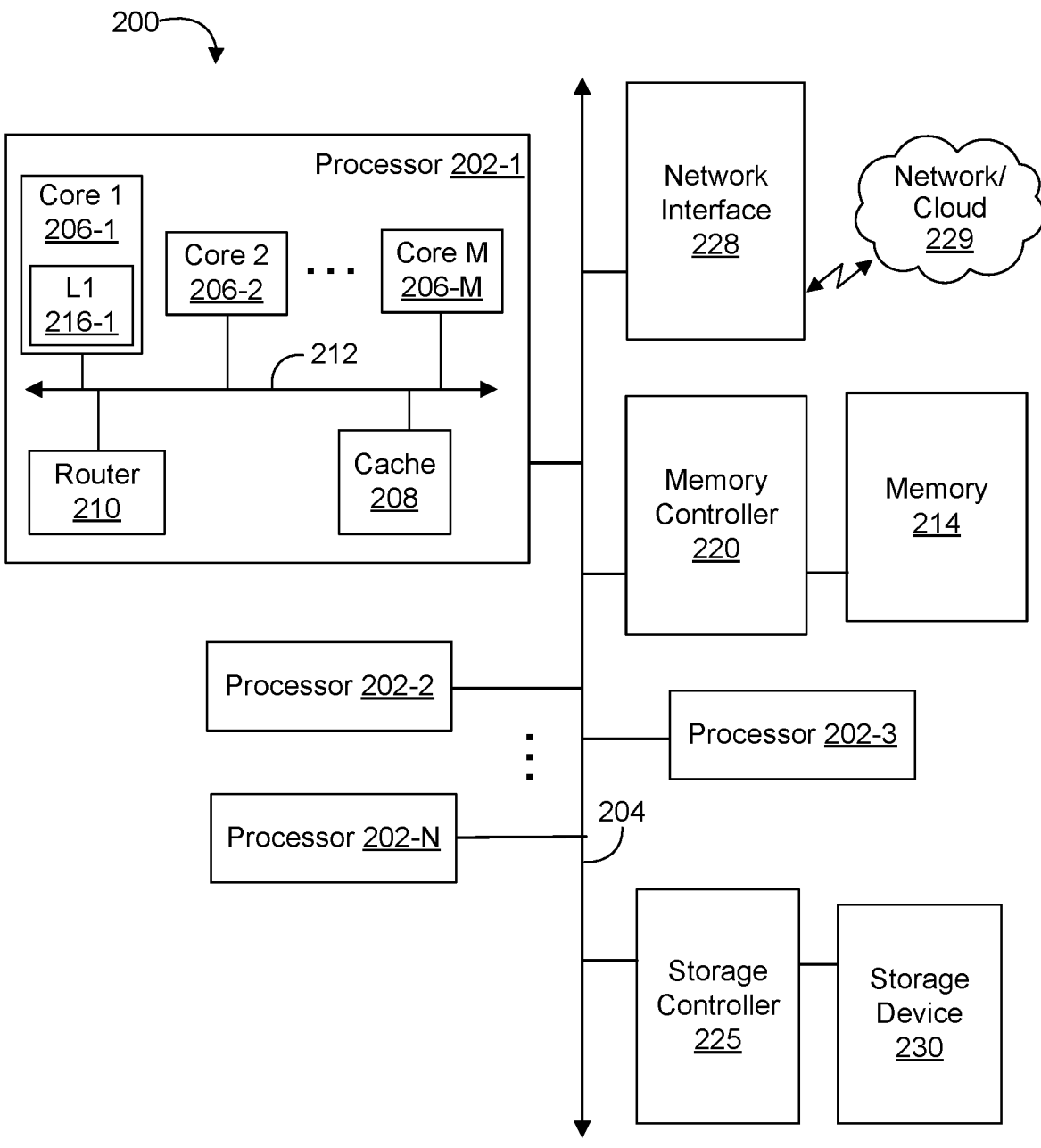
FIG. 8 is a block diagram of an example of a computing system according to an embodiment.

Turning now to FIG. 8, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 6, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 8, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 10, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, etc., to sense variations in various factors affecting power/thermal behavior of the system/platform, such as temperature, operating frequency, operating voltage, power consumption, and/or inter-core communication activity, etc.

Any of the memory and/or storage devices in the system 200 may include the additional silicide layer on top of staircase for 3D NAND WL contact connection, as described herein. In particular, the system 200 may include the processors 202 and a 3D memory device (e.g., memory 214, storage device 230, etc.) coupled to the processors 102, where the 3D memory device includes a substrate, a memory array of vertical 3D NAND strings formed in the substrate, a staircase region formed in the substrate, a poly WL extended horizontally into the staircase region, a WL contact extended vertically through the staircase region to make electrical contact with the poly WL, and a punch stop material disposed between the WL contact and the poly WL. For example, the punch stop material may comprise silicide, such as WSix, the substrate may comprise alternating layers of poly and an insulator material (e.g., such as oxide). In some embodiments, the 3D memory device may further include a pocket formed in the insulator material layer between two poly layers adjacent to the punch stop material.

ADDITIONAL NOTES AND EXAMPLES

Example 1 includes an apparatus, comprising a substrate, a memory array of vertical 3D NAND strings formed in the substrate, a staircase region formed in the substrate, a poly WL extended horizontally into the staircase region, a WL contact extended vertically through the staircase region to make electrical contact with the poly WL, and a punch stop material disposed between the WL contact and the poly WL.

Example 2 includes the apparatus of Example 1, wherein the punch stop material comprises silicide.

Example 3 includes the apparatus of Example 2, wherein the silicide comprises tungsten silicide.

Example 4 includes the apparatus of any of Examples 1 to 3, wherein the substrate comprises alternating layers of poly and an insulator material.

Example 5 includes the apparatus of Example 4, wherein the insulator material comprises an oxide.

Example 6 includes the apparatus of Example 4, further comprising a pocket formed in the insulator material layer between two poly layers adjacent to the punch stop material.

Example 7 includes a method, comprising forming a substrate, forming a memory array of vertical 3D NAND strings in the substrate, forming a staircase region in the substrate, forming a poly WL extended horizontally into the staircase region, forming a WL contact extended vertically through the staircase region to make electrical contact with the poly WL, and disposing punch stop material between the WL contact and the poly WL.

Example 8 includes the method of Example 7, wherein the punch stop material comprises silicide.

Example 9 includes the method of Example 8, wherein the silicide comprises tungsten silicide.

Example 10 includes the method of any of Examples 7 to 9, further comprising forming the substrate from alternating layers of poly and an insulator material.

Example 11 includes the method of Example 10, wherein the insulator material comprises an oxide.

Example 12 includes the method of any of Examples 10 to 11, further comprising forming respective pockets in the staircase region of the substrate in respective insulator material layers between respective poly layers.

Example 13 includes the method of Example 12, further comprising depositing a silicide layer on the substrate to cover the poly WLs that extend into the staircase region and partially fill the respective pockets.

Example 14 includes the method of Example 13, further comprising wet etching the silicide layer to remove silicide material from respective sidewalls of the pockets while leaving silicide material on the poly WLs that extend into the staircase region.

Example 15 includes a system, comprising a processor and a three-dimensional (3D) memory device coupled to the processor, wherein the 3D memory device includes a substrate, a memory array of vertical 3D NAND strings formed in the substrate, a staircase region formed in the substrate, a poly WL extended horizontally into the staircase region, a WL contact extended vertically through the staircase region to make electrical contact with the poly WL, and a punch stop material disposed between the WL contact and the poly WL.

Example 16 includes the system of Example 15, wherein the punch stop material comprises silicide.

Example 17 includes the system of Example 16, wherein the silicide comprises tungsten silicide.

Example 18 includes the system of any of Examples 15 to 17, wherein the substrate comprises alternating layers of poly and an insulator material.

Example 19 includes the system of Example 18, wherein the insulator material comprises an oxide.

Example 20 includes the system of any of Examples 18 to 19, wherein the 3D memory device further comprises a pocket formed in the insulator material layer between two poly layers adjacent to the punch stop material.

Example 21 includes a method of manufacturing a memory device, comprising forming a substrate of alternating layers of poly and oxide to form a stack of alternating conductor and insulator layers, forming a staircase region in the substrate with respective exposed poly WLs on each step of the staircase, wet etching the substrate to remove oxide from the insulator layers and form respective recesses between respective poly layers, and depositing a punch stop layer on the substrate to cover the exposed poly WLs in the staircase region and partially fill the respective recesses.

Example 22 includes the method of Example 21, further comprising wet etching the substrate to remove punch stop material from the recesses and electrically isolate the respective poly layers from each other.

Example 23 includes the method of Example 22, further comprising depositing an oxide layer on the substrate to cover the punch stop material and fill the respective recesses.

Example 24 includes the method of Example 23, further comprising depositing an etch stop layer on the substrate over the oxide layer, depositing an oxide gap fill on the etch stop layer, and forming a memory array of vertical 3D NAND strings in the substrate outside the staircase region.

Example 25 includes the method of Example 24, further comprising forming respective WL contact channels in the staircase region through the oxide gap fill to the etch stop layer, and punching the WL contact channels through the etch stop layer to the punch stop layer.

Example 26 includes the method of Example 25, further comprising filling the WL contact channels with conductive material to provide respective WL contacts to the poly WLs in the staircase region.

Example 27 includes the method of any of Examples 21 to 26, wherein the punch stop material comprises silicide.

Example 28 includes the method of any of Examples 24 to 27, wherein the etch stop layer comprises silicon nitride.

Example 29 includes an apparatus, comprising means for forming a substrate, means for forming a memory array of vertical 3D NAND strings in the substrate, means for forming a staircase region in the substrate, means for forming a poly WL extended horizontally into the staircase region, means for forming a WL contact extended vertically through the staircase region to make electrical contact with the poly WL, and means for disposing punch stop material between the WL contact and the poly WL.

Example 30 includes the apparatus of Example 29, wherein the punch stop material comprises silicide.

Example 31 includes the apparatus of Example 30, wherein the silicide comprises tungsten silicide.

Example 32 includes the apparatus of any of Examples 29 to 31, further comprising means for forming the substrate from alternating layers of poly and an insulator material.

Example 33 includes the apparatus of Example 32, wherein the insulator material comprises an oxide.

Example 34 includes the apparatus of any of Examples 32 to 33, further comprising means for forming respective pockets in the staircase region of the substrate in respective insulator material layers between respective poly layers.

Example 35 includes the apparatus of Example 34, further comprising means for depositing a silicide layer on the substrate to cover the poly WLs that extend into the staircase region and partially fill the respective pockets.

Example 36 includes the apparatus of Example 35, further comprising means for wet etching the silicide layer to remove silicide material from respective sidewalls of the pockets while leaving silicide material on the poly WLs that extend into the staircase region.

Example 37 includes an apparatus to manufacture a memory device, comprising means for forming a substrate of alternating layers of poly and oxide to form a stack of alternating conductor and insulator layers, means for forming a staircase region in the substrate with respective exposed poly WLs on each step of the staircase, means for wet etching the substrate to remove oxide from the insulator layers and form respective recesses between respective poly layers, and means for depositing a punch stop layer on the substrate to cover the exposed poly WLs in the staircase region and partially fill the respective recesses.

Example 38 includes the apparatus of Example 37, further comprising means for wet etching the substrate to remove punch stop material from the recesses and electrically isolate the respective poly layers from each other.

Example 39 includes the apparatus of Example 38, further comprising means for depositing an oxide layer on the substrate to cover the punch stop material and fill the respective recesses.

Example 40 includes the apparatus of Example 39, further comprising means for depositing an etch stop layer on the substrate over the oxide layer, means for depositing an oxide gap fill on the etch stop layer, and means for forming a memory array of vertical 3D NAND strings in the substrate outside the staircase region.

Example 41 includes the apparatus of Example 40, further comprising means for forming respective WL contact channels in the staircase region through the oxide gap fill to the etch stop layer, and means for punching the WL contact channels through the etch stop layer to the punch stop layer.

Example 42 includes the apparatus of Example 41, further comprising means for filling the WL contact channels with conductive material to provide respective WL contacts to the poly WLs in the staircase region.

Example 43 includes the apparatus of any of Examples 37 to 42, wherein the punch stop material comprises silicide.

Example 44 includes the apparatus of any of Examples 40 to 43, wherein the etch stop layer comprises silicon nitride.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An apparatus, comprising:
a substrate formed from alternating layers of polysilicon and an insulator material;
a memory array of vertical 3D NAND strings formed in the substrate;
a staircase region formed in the substrate, the staircase region further including respective pockets formed in respective insulator material layers between respective polysilicon layers;
a polysilicon wordline extended horizontally into the staircase region;
a wordline contact extended vertically through the staircase region to make electrical contact with the polysilicon wordline;
a silicide layer disposed on the substrate to cover the polysilicon wordline that extends into the staircase region and to partially fill the respective pockets; and
a punch stop material disposed between the wordline contact and the polysilicon wordline.

2. The apparatus of claim 1, wherein the punch stop material comprises silicide.

3. The apparatus of claim 2, wherein the silicide layer comprises tungsten silicide.

4. The apparatus of claim 1, wherein the insulator material comprises an oxide.

5. The apparatus of claim 1, the respective pockets further comprising:
a first pocket formed in the insulator material between two corresponding polysilicon layers adjacent to the punch stop material.

6. The apparatus of claim 1, wherein the punch stop material at least partially wraps around an end edge of the polysilicon wordline in the staircase region.

15

7. A method, comprising:

forming a substrate from alternating layers of polysilicon and an insulator material;

forming a memory array of vertical 3D NAND strings in the substrate;

forming a staircase region in the substrate;

forming respective pockets in the staircase region in the substrate in respective insulator material layers between respective polysilicon layers;

forming a polysilicon wordline extended horizontally into the staircase region; forming a wordline contact extended vertically through the staircase region to make electrical contact with the polysilicon wordline;

depositing a silicide layer on the substrate to cover the polysilicon wordline that extends into the staircase region and to partially fill the respective pockets; and disposing punch stop material between the wordline contact and the polysilicon wordline.

8. The method of claim 7, wherein the punch stop material comprises silicide.

9. The method of claim 8, wherein the silicide layer comprises tungsten silicide.

10. The method of claim 7, wherein the insulator material comprises an oxide.

11. The method of claim 7, further comprising:

wet etching the silicide layer to remove silicide material from respective sidewalls of the pockets while leaving silicide material on the polysilicon wordline that extends into the staircase region.

12. The method of claim 7, wherein the punch stop material at least partially wraps around an end edge of the polysilicon wordline in the staircase region.

16

13. A system, comprising:

a processor and a three-dimensional (3D) memory device coupled to the processor, wherein the 3D memory device includes:

a substrate formed from alternating layers of polysilicon and an insulator material;

a memory array of vertical 3D NAND strings formed in the substrate;

a staircase region formed in the substrate, the staircase region further including respective pockets formed in respective insulator material layers between respective polysilicon layers;

a polysilicon wordline extended horizontally into the staircase region;

a wordline contact extended vertically through the staircase region to make electrical contact with the polysilicon wordline;

a silicide layer deposited on the substrate to cover the polysilicon wordline that extends into the staircase region and to partially fill the respective pockets; and a punch stop material disposed between the wordline contact and the polysilicon wordline.

14. The system of claim 13, wherein the punch stop material comprises silicide.

15. The system of claim 14, wherein the silicide layer comprises tungsten silicide.

16. The system of claim 13, wherein the insulator material comprises an oxide.

17. The system of claim 13, wherein the respective pockets of the 3D memory device further include:

a first pocket formed in the insulator material between two corresponding polysilicon layers adjacent to the punch stop material.

18. The system of claim 13, wherein the punch stop material at least partially wraps around an end edge of the polysilicon wordline in the staircase region.

* * * * *